United States Patent [19]

Gambino et al.

[11] 4,435,663
[45] Mar. 6, 1984

[54] THERMOCHEMICAL MAGNETIC GENERATOR

[75] Inventors: Richard J. Gambino, Thalwil, Switzerland; Ralph R. Ruf, New York, N.Y.

[73] Assignee: International Business Machines Corporation, Armonk, N.Y.

[21] Appl. No.: 252,655

[22] Filed: Apr. 9, 1981

[51] Int. Cl.³ ............................................. H01J 45/00
[52] U.S. Cl. .................................................... 310/306
[58] Field of Search ......................................... 310/306

[56] References Cited

U.S. PATENT DOCUMENTS

| | | | |
|---|---|---|---|
| 407,762 | 7/1889 | Acheson | 310/306 |
| 2,510,801 | 6/1950 | Chilowsky | 171/125 |
| 2,893,624 | 7/1959 | Fricke | 230/69 |
| 3,477,878 | 11/1969 | Hughes et al. | 136/86 |

OTHER PUBLICATIONS

M. Ohkoshi, et al, "Rotational-Type Spin Reorientation in $Nd_{1-x}Dy_xCo_5$ and Its Application to Thermomagnetic Generator", IEEE Transactions on Magnetics, vol. Mag-13, No. 5, Sep. 1977, pp. 1158-1160.

Y. Shimada et al, "Thermomagnetic Generators Using Low Curie Temperature Materials", a paper given at Intermag-MMM Conf., NY, 1979, but not published in the Proceedings of the Conf. IEEE Transactions on Magnetics, vol. Mag-15, No. 6, Nov. 1979.

S. Wolf, "Hydrogen Sponge Heat Pump", Tenth Intersociety Energy Conversion Eng. Conf., IECEC '75 Record, pp. 1348-1351.

J. R. Powell, et al, "High Efficiency Power Conversion Cycles Using Hydrogen Compressed by Absorption on Metal Hydrides", IECEC 1975 Record (Supra), pp. 1339-1347.

K. Nomura, et al, "A Novel Thermal Engine Using Metal Hydride", Energy Conversion, vol. 19, No. 1, Pergamon Press, pp. 49-57.

Primary Examiner—Donovan F. Duggan
Attorney, Agent, or Firm—Shelley M. Beckstrand; Graham S. Jones, II

[57] ABSTRACT

A thermochemical magnetic generator system utilizes a gas, preferably hydrogen, and a material, such as $LaCo_5$, which varies in magnetization upon addition of the gas to the material to generate electricity from a magnetic circuit which includes the magnetizable material in the circuit. When the gas partial pressure is reduced or heat is applied to the material which has combined with the gas, then the gas is driven off in a thermochemical reaction which reverses the magnetization of the system. In particular, the addition of hydrogen gas to $LaCo_5$ reduces the magnetization and its removal from the material increases the magnetization. Rapid reversal of the pressure cycle or heating and cooling cycles with a plurality of chambers through which the gas is admitted and exhausted reversibly can be used as a source of electricity.

15 Claims, 7 Drawing Figures

T IS TEMPERATURE
$T_R$ IS ROOM TEMPERATURE
P IS PRESSURE (PSI)

THERMOCHEMICAL MAGNETIC GENERATOR

FIELD OF THE INVENTION

This invention relates to a thermochemical magnetic generator for the generation of electrical power. More specifically, it relates to a thermochemical magnetic generator using hydrogen as a working gas, and magnetic intermetallic compounds which absorb hydrogen as the working magnetic material.

DESCRIPTION OF THE PRIOR ART

Thermomagnetic generators are devices that convert heat to electricity. In the usual embodiment, a magnetic material is cycled between a state of high magnetization and a state of low magnetization by the application of heat. With a suitable arrangement of applied magnetic fields, the change in magnetization can cause a flux change which induces an electromotive force in a conductor positioned to pick up the changing flux. The magnitude of the induced electromotive force (EMF), hereafter designated as E, is:

$$E = d\phi/dt \qquad (1)$$

which is the negative time derivative of the magnetic flux, $d\phi$.

M. Ohkoshi, et al, *Rotational-Type Spin Reorientation in $Nd_{1-x}Dy_xCo_5$ and Its Application to Thermomagnetic Generator*, IEE Transactions on Magnetics, Vol. MAG-13, No. 5, Sept. 1977, pages 1158–1160, describe such a thermomagnetic generator. Ohkoshi, et al, observe that certain rare earth (R)-cobalt intermetallic compounds $RCo_5$, such as $NdCo_5$ and $DyCo_5$, exhibit a rotational-type spin reorientation (SR) phenomenon useful in thermomagnetic transducers. By adjusting the Dy concentration in a single crystal of the mixed system of $NdCo_5$ and $DyCo_5$, the SR temperature is established within the neighborhood of room temperature. An example of a thermomagnetic generator is described using a magnetic circuit comprising two permalloy yokes interconnecting an $NdCo_5$ crystal and a permanent magnet, such as $SmCo_5$. In order to change the temperature of the $NdCo_5$ crystal, intermittent infrared light is irradiated, and cold $N_2$ gas is used as a coolant. The magnetic flux paths, switched between the two permalloy yokes by the temperature change of the $NdCo_5$ crystal, are picked up by coils wound around each yoke and connected in series with reverse polarity.

A similar thermomagnetic generator is described by Y. Shimada, et al, *Thermomagnetic Generators Using Low Curie Temperature Materials*, a paper given at Intermag-MMM Conference, New York, 1979, but not published in the proceedings of the Conference, IEEE Transactions On Magnetics, Vol. MAG-15, No. 6, Nov. 1979. The Shimada, et al, thermomagnetic generator is illustrated in FIG. 1, comprising working magnetic material 20 and permanent magnet 21 interconnected in a magnetic circuit by soft iron bars 22 and 23. Sources 24, 25 of hot and cold fluid, respectively, are switched by valves 26 and 27 to alternatively heat and cool working magnet 20. Electrically conductive coils 28 and 29 are wound around iron bars 22, 23. In operation, valve 26 is opened to cause the hot fluid, such as hot water, to contact the working magnetic material 20. The magnetization of magnet 20 decreases as it is heated, so the flux permeating soft iron bars 22, 23 decreases. The collapse of the flux induces a positive electromotive force in coils 28, 29, as given by equation (1). Next, valve 26 is closed, and valve 27 opened to circulate cold water to working magnet 20. As magnet 20 cools, its magnetization increases, inducing a reverse electromotive force in coils 28, 29 of $-E$. The process is repeated cyclically to produce an alternating current.

U.S. Pat. No. 2,510,801 (Chilowsky) describes a system for producing electrical and mechanical energy from thermal energy using ferromagnetic Curie point effects. Chilowsky suggests the use of composite laminations, having a composition progressively varying from one end to the other, with a corresponding progressive varying of the Curie intervals. This lamination is used in a magnetic circuit subjected to rapid alternating heating and cooling, causing varying flux inducing an alternating electric current in armature windings, a portion of the heat being thereby transformed into electric energy. Devices of the Chilowsky type have a problem in varying the temperature quickly over a large temperature range.

Such prior art thermomagnetic generators generally require a large temperature change to produce a large flux change; further, it is intrinsically difficult to rapidly switch hot and cold fluids without mixing them, and the apparatus (e.g., pumps) required to circulate the hot and cold working fluids consume energy, thus decreasing the overall efficiency of the system. In order to rapidly switch the magnetization of a working magnet, a small magnet and a high $\Delta T$ sink/source is required.

S. Wolf, *Hydrogen Sponge Heat Pump*, Tenth Intersociety Energy Conversion Engineering Conference, IECEC '75 Record, pp. 1348–1351, describes the use of the rare earth intermetallic compound, lanthanum pentanickel ($LaNi_5$) as a hydrogen sponge, a material which can selectively absorb hydrogen exothermically and desorb it reversibly and endothermically. Its use as a heat pump for comfort heating and air conditioning, and as a heat engine, where useful shaft work is taken off of an expander as hydrogen is being transferred from one hydrogen sponge to another, is suggested. J. R. Powell, et al, *High Efficiency Power Conversion Cycles Using Hydrogen Compressed by Absorption on Metal Hydrides*, IECEC '75 Record (Supra), pages 1339–1347, further examines the operation of intermetallic compounds for hydride compressors, such as FeTi and $LaNi_5$, and their use in the generation of electricity. In Powell, the power conversion cycle uses $H_2$ gas as a working fluid in a regenerative closed Brayton cycle: $H_2$ is compressed by cyclic absorption/desorption on a metal hydride bed instead of being mechanically compressed. The high pressure $H_2$ is delivered from a metal hydride compressor, which uses a low grade heat source, to be heated by a high grade heat source and then allowed to expand adiabatically through a turbine for generation of electrical power. K. Nomura, et al, *A Novel Thermal Engine Using Metal Hydride*, Energy Conversion, Vol. 19, No. 1, Pergamon Press, pages 49–57, further investigates a piston engine using $LaNi_5H_x$ in two metallic containers to drive a piston as one container is heated and the other cooled. The thermal engines of Wolf, Powell, and Nomura, each based on the hydride cycle, share the disadvantage that electricity is produced indirectly; at best, only about 70% of the mechanical energy of a thermal engine can be converted to electricity, and many moving parts are required.

U.S. Pat. No. 2,893,624 (Fricke) describes an apparatus for developing an ultra high vacuum. The vacuum pump comprises a ferromagnetic disk or belt support on which is coated an absorptive medium for residual gas ions located in the ultrahigh vacuum chamber. As the disk or belt is rotated into an adjoining high vacuum chamber, it is locally heated and thereby the ions are desorbed from the disk coating. The ferromagnetic disk is also located in the nonhomogeneous field of a permanent magnet so that the magnetic field lines cross the disk at right angles. By the local heating of the disk support and absorptive coating in the higher pressure chamber, which is necessary to remove the absorbed residual gas molecules, the support disk loses its ferromagnetic properties and becomes non-magnetic. After the temperature has exceeded the Curie point, there exists in the field of the permanent magnet a substance (the support disk) which is magnetically asymmetrical with respect to the magnetic field; consequently, a corresponding torsion is exerted. This torsion rotates the disk to further evacuate the very high vacuum chamber, by continuously absorbing ions into the absorptive coating on the disk in the very high vacuum chamber and desorbing them in the heated high vacuum chamber. In Fricke, there is no chemical reaction varying the inductance of a magnetic circuit for the generation of an electromagnetic force (as heat is used to vary the ferromagnetic properties of the disk support). Fricke is a pump for gases.

U.S. Pat. No. 3,477,878 (Hughes et al) describes a system for conversion of thermodynamic free energy in fuel gases into electrical energy by introducing two gases such as hydrogen and oxygen into a chamber and combining them in an area between two electrode screens within a magnetic field. An RF electrical field is applied for the purpose of ionizing the gas molecules. The electrons are forced by the magnetic field to pass through an electrode through the load. In Hughes, no magnetic material is involved, and its magnetization is not changed. Instead, an ionized conducting gas experiences a force when passing through the magnetic field.

U.S. Pat. No. 407,762 (Acheson) describes a "calelectric generator", including an annular magnetic core. An alternating current is applied to the core by a primary coil, inducing an electrical energy in a secondary coil. A heat source is applied to the core to increase the electrical energy induced in the secondary coil.

The main problem with prior art magnetic generators is that a large temperature change (heating, generally, past the Curie point) is required to produce a large change in magnetization and this change must be accomplished cyclically (thus, a large thermal mass must be cooled) in a short time to produce a large induced electromotive force (as shown by equation 1). This problem has been addressed in the prior art by using hot and cold heat transfer media which are rapidly and alternately brought into contact with the magnetic material, and some mixing of the working fluids, or media, is inevitable. Prior art thermal engines using metal hydrides indirectly produce magnetic energy in contrast to the direct production of electrical energy in the present invention. Thus, a hydride is heated to drive off a gas which turns a turbine, which turbine requires close tolerance moving parts. The present invention provides a method and apparatus for producing a large change in magnetization by using a thermochemical reaction. Low grade, continuous heat sources can thus be used and rapid changes in the chemical environment (for example, gas pressure) are used to produce a large change in magnetization.

SUMMARY OF THE INVENTION

The invention provides a thermochemical magnetic generator having a magnetic material in an environment. The magnetic material is located in a magnetic circuit, and is cycled between a state of high magnetization and a state of low magnetization to generate in response to a variation in the magnetization of the magnetic material an electromotive force in a solenoid coil wound about the magnetic circuit. The magnetization of the magnetic material is varied by means of a thermochemical reaction between the magnetic material and its environment.

In accordance with a further aspect of the invention, the thermochemical reaction is reversible, and the reaction is initiated by and reversed by alternatively admitting and removing a substance from the environment of the magnetic material.

In accordance with still a further aspect of the invention, the substance alternatively admitted to and removed from the environment of the magnetic material is hydrogen gas $H_2$.

In accordance with still a further aspect of the invention, the magnetic material includes an intermetallic compound which shows a relatively large change in magnetization when hydrided by absorbing hydrogen reversibly and exothermically at moderate hydrogen partial pressures.

In accordance with a still further aspect of the invention, the magnetic material includes lanthanum cobalt $LaCo_5$, and the thermochemical reaction involves the addition of hydrogen $H_2$ to the environment of the magnetic material to be absorbed by the $LaCo_5$ to reduce its magnetization, and removal of hydrogen from the environment to increase the magnetization.

DESCRIPTION OF THE PREFERRED EMBODIMENTS

The thermochemical magnetic generator of the invention utilizes a gas or like material, and a magnetizable material which varies in magnetization upon addition of the gas or like material to the magnetizable material to generate electricity in a magnetic circuit which includes the magnetizable material as the working magnetic material. When the partial pressure of the gas or like material is reduced to the magnetizable material which has combined with the gas or like material, then the gas or like material is driven off in an endothermic reaction which increase the magnetization of the working magnetic material and, consequently, of the magnetic circuit. Rapid, cyclic reversal of the high and low partial pressure within one or more chambers containing the working magnetic material and through which the gas or like material is admitted and exhausted reversibly can be used as a source of electricity.

Figure 2:
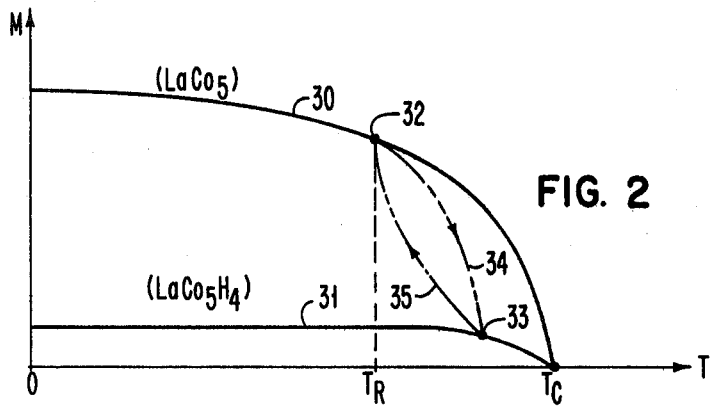
FIG. 2 is a temperature-magnetization diagram for lanthanum cobalt $LaCo_5$ and its hydride $LaCo_5H_4$.

A preferred thermochemical magnetic generator uses hydrogen $H_2$ as the gas or like material, and magnetic intermetallic compounds which absorb hydrogen as the working magnetic material. Many intermetallics between the rare earth elements of the actinide elements and the first transition metals absorb hydrogen reversibly and exothermically at moderate hydrogen partial pressures. Some of these compounds also show large changes in magnetization when hydrided. For example, in FIG. 2, are shown the magnetization 30 of lanthanum cobalt $LaCo_5$ and the magnetization 31 of its hydride $LaCo_5H_4$ as a function of temperature, from zero degrees Kelvin to the Curie temperature $T_c$. The hydride $LaCo_5H_4$ can be converted back to the intermetallic $LaCo_5$ by reducing the hydrogen $H_2$ partial pressure below its equilibrium pressure, or by heating it. (Refer to FIG. 7.)

Figure 1:
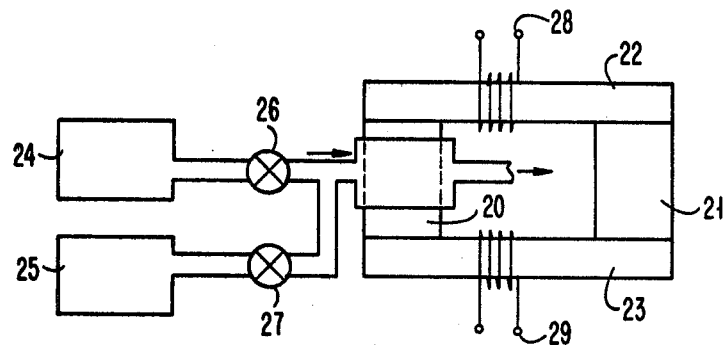
FIG. 1 is a schematic flow diagram illustrating a prior art thermomagnetic generator.
Figure 3:
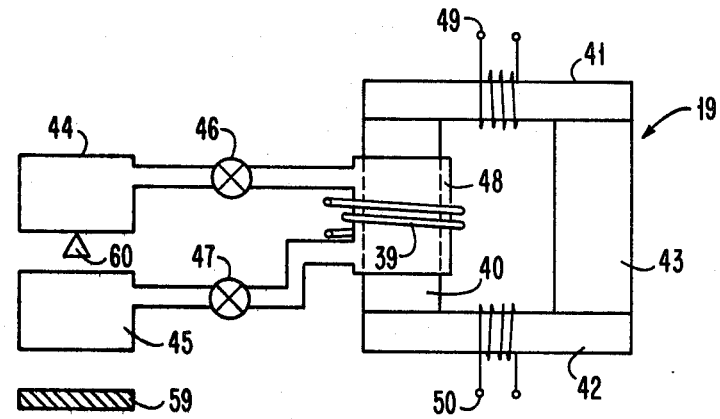
FIG. 3 is a schematic flow diagram illustrating a thermochemical magnetic generator in accordance with the invention.

Referring to FIG. 3, one embodiment of the thermochemical magnetic generator of the invention is shown. Working magnet 40 and permanent magnet 43 are interconnected in a magnetic circuit by magnetic conductors 41, 42, which may be soft iron. Herein, working magnet 40 may be $LaCo_5$. A source 44 of high pressure $H_2$ is provided, and herein comprises a bed of lanthanum nickel hydride $LaNi_5H_4$ in a pressure vessel. When the $LaNi_5H_4$ is heated, it provides a high hydrogen partial pressure by the decomposition reaction:

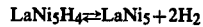

$$LaNi_5H_4 \rightleftharpoons LaNi_5 + 2H_2 \qquad (2)$$

When valve 46 is opened, the working magnetic material $LaCo_5$ is exposed to the high hydrogen partial pressure, and it chemically reacts to form $LaCo_5H_4$. The magnetization (M) of the working magnetic material 40 decreases, following line 34 in FIG. 2, from point 32 to point 33 because it is converted to the low magnetization hydride $LaNi_5H_4$. The magnetization decreases further because the exothermic absorption reaction heats the $LaCo_5H_4$, causing a shift of temperature from $T_r$ towards $T_c$. At point 33, valve 46 is closed and valve 47 is opened. When valve 47 is opened, the $LaNi_5$ bed in source 45 is exposed to the hydrogen in the working chamber 48 containing the $LaCo_5H_4$. The lanthanum nickel $LaNi_5$ in source 45 is kept cool by means of heat sink 59. At this lower temperature, the reverse reaction of equation (2) takes place: that is, the $LaNi_5$ reacts with hydrogen to form $LaNi_5H_4$. As the hydrogen is thus absorbed into source 45, the $LaCo_5H_4$ in working chamber 48 decomposes to form the high magnetization $LaCo_5$ phase. Since the decomposition reaction is endothermic, the $LaCo_5$ also cools so that the magnetization follows line 35 of FIG. 2 from point 33 to point 32. At point 32, the cycle is repeated by closing valve 47 and opening valve 46. The change in magnetization of working magnetic material 40 induces an electromotive force in coils 49, 50 surrounding soft iron bars 41. When source 44 becomes depleted of hydrogen and source 45 becomes saturated, they can be recycled by operating the system in reverse with the heat source 60 applied to source 45, and the heat sink 59 to source 44. Coolant is circulated by coils or channels 39 through or about working magnet 40 to increase the rate of the hydriding step along path 34. The rate of the hydriding reaction is usually controlled by the rate at which the exothermic heat of reaction can be extracted. The heat transfer through the $LaCo_5$ itself and through the walls of the chamber is not sufficient to extract all the heat evolved, however, resulting in a net temperature increase from $T_r$ to the temperature at point 33.

The thermochemical magnetic generating system of FIG. 3 has several advantageous features. Heat source 60 and heat sink 59 can be applied continuously, so the difficult step of alternately supplying hot and cold working fluids is eliminated. A large change in magnetization is produced (between points 32 and 33) thus giving higher output voltages at 49, 50. And cycle times can be fast, with cycle times as fast as 0.8 seconds having been observed in prior art mechanical heat engines using $LaNi_5H_x$. (See Nomura, et al, supra.) Finally, the only moving parts required are the two valves 46, 47, eliminating the energy consuming pumps of the prior art.

Figure 4:
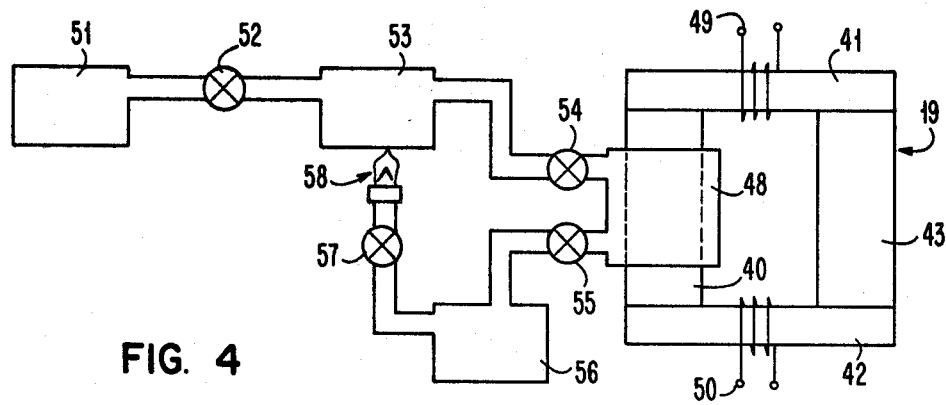
FIG. 4 is a schematic flow diagram illustrating a second embodiment of the thermochemical magnetic generator of the invention, using hydrogen as a heat source.

Heat source 60 can be a solar absorber or the waste heat from a conventional steam electric generating plant. For large scale operation, a multiplicity of working chambers like 48 in FIG. 3 would be provided. These chambers can operate from a common source and sink like 44 and 45, respectively. The multiple working chambers can also utilize valves 46 and 47 in common. In order to maximize the time rate of change of flux in the magnetic circuit, efficient partial pressure and/or heat transfer to and from the working magnetic material is required. Also, the magnetic circuit must efficiently convert a change in the magnetization of the working magnetic material into a change in the magnetic flux through the turns of coils 49 and 50. Both of these considerations suggest that scale-up be accomplished by using a plurality of devices operating from a common source and sink rather than by using a single large device. In the embodiment of FIG. 4, hydrogen source 53, 56 is used as a storage tank for hydrogen fuel to operate the system. Source 53, 56 would then have to be recharged from an external supply 51 of hydrogen, such as a pipeline, a compressed gas cylinder, or apparatus for extracting hydrogen from the air, water, ammonia produced by anaerobic bacterial metabolization of waste materials, and so forth.

In the embodiment illustrated in FIG. 4, valve 54 is opened to charge $LaCo_5$ working magnetic material 40 with hydrogen. Then, valve 54 is closed and valve 55 is opened to discharge hydrogen from magnetic material 40 into ballast tank 56. The hydrogen exits ballast tank 56 through pressure regulator valve 57, and is burned at burner 58 to heat source 53 to generate the hydrogen. When source 51 is depleted, it is recharged from the external source of hydrogen through valve 52. In this embodiment, source 53 serves as a non-mechanical compressor, to generate the high $H_2$ partial pressure for hydriding working magnetic material 40 in chamber 48.

Figure 5:
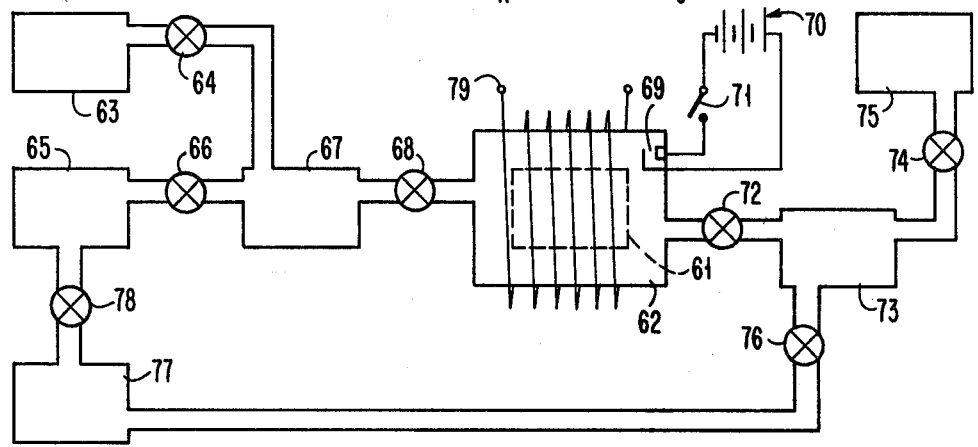
FIG. 5 is a schematic flow diagram illustrating yet another embodiment of the thermochemical magnetic generator of the invention, using an internal combustion chamber.

In FIG. 5 is set forth another embodiment of the thermochemical magnetic generator of the invention, this embodiment providing an internal combustion engine for the direct production of electrical power. The required hydrogen pressure, temperature cycle is obtained by the combustion of a hydrogen-oxygen mixture in chamber 62 containing working magnetic material 61.

With valves 64 and 66 opened, hydrogen from source 65 is mixed in mixing chamber 67 with oxygen from source 63. Valve 68 is then opened to admit the combustible mixture of hydrogen and oxygen to working chamber 62. A mixture of four volume percent $O_2$ in $H_2$ at a total pressure of 20 psi is suitable. Valve 68 is then closed, and switch 71 closed to activate spark plug 69 to ignite the combustible mixture thereby charging (hydriding) the lanthanum cobalt core 61 (path 34, FIG. 2). As working magnet 61 is hydrided, its magnetization decreases thereby inducing an electromotive force in coil 79 wound around working magnet 61. During combustion, the temperature and pressure in chamber 62 rises. At a predetermined pressure, pressure valve 72 opens, and the pressure in chamber 62 decreases suddenly. The $LaCo_5H_x$ core 61 has been heated by the combustion step, so it decomposes rapidly in the low hydrogen partial pressure. The exhaust gas mixture of water and hydrogen gas passes through a water extractor to remove the water through valve 74 to sump 75. The unused hydrogen is then directed through valve 76 to be stored in source 77, which may be a cooled bed of lanthanum pentanickel $LaNi_5$. When hydrogen source 65 is depleted, it may be replenished from source 77 through valve 78, or from some other source as discussed elsewhere in connection with hydrogen source 51.

Very fast cycle times should be possible using the internal combustion mode of FIG. 5. As the rate of heat extraction will determine the cycle rate, cooling coils (similar to coils 39) may be required.

The efficiency of the thermochemical magnetic generator of the invention is expected to be similar to that of thermal engines based on the hydride cycle. Nomura, et al, supra, have reported operating a thermal engine using lanthanum pentanickel $LaNi_5$ with an efficiency of 7.4%, whereas the calculated Carnot efficiency is 17%. Because the thermochemical magnetic generator also requires very few moving parts, an operating life longer than that for thermal engines based on the hydride cycle is expected. Further, the thermochemical magnetic generator of the invention produces electricity directly in coils 79, whereas only about 70% of the mechanical energy of the thermal engine can be converted to electricity.

Figure 6:
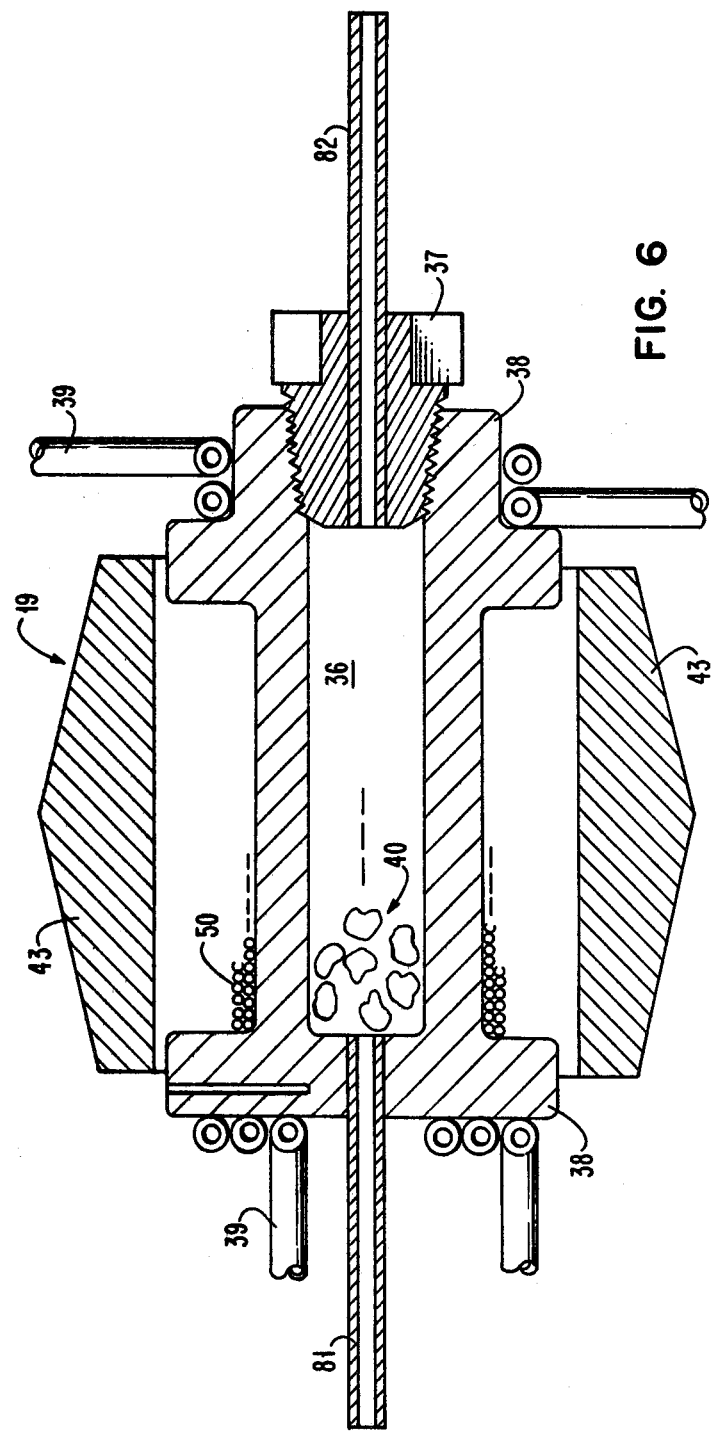
FIG. 6 is a mechanical drawing illustrating the magnetic circuit portion, a thermochemical magnetic generator constructed in accordance with the embodiments of FIGS. 3 and 4.

Referring now to FIG. 6, a description of a prototype thermochemical magnetic generator 19 will be given, demonstrating the feasibility of generating electricity in places where only a low grade heat source ($\Delta T \simeq 50° C.$) is available. The structure of generator 19 includes a stainless steel container 38 in the shape of a spool with a cavity 36 into which hydrogen absorber $La_1Co_5$ is placed, forming working magnetic material 40. (Container 38 provides the structure for both working chamber 48 and magnetic conductors 41, 42 of FIGS. 3 and 4.) Along the axis of container 38 are two ¼ inch lines for hydrogen input line 81 and output line 82, with line 81 fixedly attached to spool 38 and line 82 attached by nut 37.

Optionally, cooling for the heat of reaction is provided by ¼ inch diameter copper lines 39, which are wrapped around the sides of spool 38, and may be brazed thereto for good thermal contact. Eleven thousand turns of insulated copper wire (AWG 32) are wound onto stainless steel spool 38 to form coil 50.

The whole core assembly 37, 38, 39, 50, 81, 82 is placed in the center of a 1000 oersted cylindrical permanent magnet 43, such that a magnetic circuit is formed which will have a large number of magnetic field lines pass through core 40 when the $LaCo_5$ is not hydrided and, therefore, in a highly ferromagnetic state, and a smaller number when hydrogen is added to cavity 36 and $LaCo_5H_{3.5}$ is formed which has a lower magnetization. The net result is to generate a movement of magnetic field lines through copper wire 50 and induce a voltage.

Figure 7:
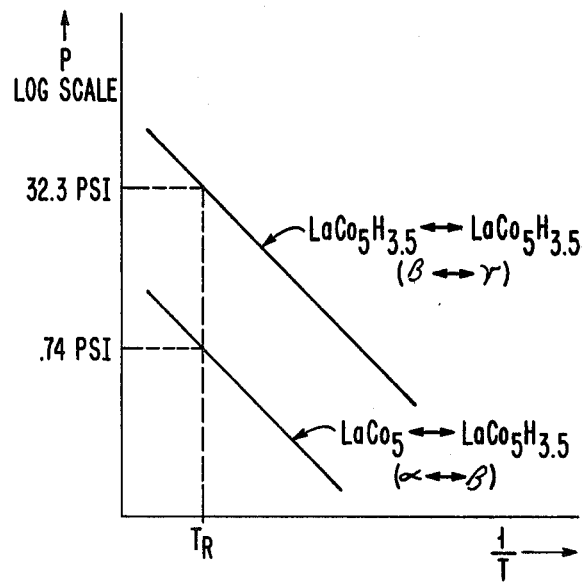
FIG. 7 is an equilibrium temperature-pressure phase diagram for the reactions $LaCo_5 \rightleftarrows LaCo_5H_{3.5}$ and $LaCo_5H_{4.5}$.

Referring to FIG. 7, the interrelationship of temperature, pressure and magnetic properties of lanthanum cobalt hydride is shown, giving the equilibrium pressures for a given temperature for the two reactions:

(3)

(4)

The $LaCo_5$ will be designated the alpha $\alpha$ phase, $LaCo_5H_{3.5}$ the beta $\beta$ phase, and $LaCo_5H_{4.5}$ the gamma $\gamma$ phase.

The thermochemical magnetic generator of FIG. 6 has been operated on the $\alpha \leftarrow\!\!\rightarrow \beta$ transition at room temperature, with a hydrogen $H_2$ source in line 81 at 120 psi, a $LaCo_5$ packing density in cavity 36 of 75% and a cycle rate in the order of one second, to generate 8 millivolts in coil 50 using pure hydrogen $H_2$, and to generate a voltage of 1/5 millivolt in the $\alpha \rightarrow \beta$ transition and ⅛ millivolt in the $\beta \rightarrow \alpha$ transition using the nonflammable 10% $H_2$ 90% Ar gas mixture.

The operation of the thermochemical magnetic generator of FIG. 6 can probably be improved by a factor of two to four if channels are provided through core 40 or the material is situated in a way to reduce the packing density below 75% to enhance hydrogen diffusion and increase the low magnetization $\beta$ phase mixed in with the $\alpha$ phase to present a strong magnetic reluctance at the conclusion of the hydriding portion of the cycle. The large air gaps and fringing fields also significantly reduced the performance of this prototype. Eliminating the air gaps and fringing fields and using a high strength rare earth permanent magnet in series with powdered $LaCo_5$ with the right packing density should result in a 1000 fold increase in the output.

While the invention has been described with respect to preferred embodiments thereof, it is apparent that the foregoing and other changes may be made thereto without departing from the invention.

For example, any material where a low magnetization phase may be formed by the addition of a reacting medium may be used. Also, the magnetic circuit geometries shown are merely illustrative. Also, this principle could be used in a transducer for determining the introduction of hydrogen into a container or pipe.

What is claimed is:

1. In a thermomagnetic generator employing a magnetic material in a predetermined environment cycled between a state of high magnetization and a state of low magnetization positioned in a magnetic circuit, with solenoid coils wound about said circuit, for generating an electrical voltage in response to a variation in the magnetization of said magnetic material, the improvement comprising varying said magnetization by means of a thermochemical reaction.

2. The method of claim 1 wherein said thermochemical reaction is reversible and is initiated by and reversed by reversing the process of admission and removal of a substance from said environment of said magnetic material.

3. The method of claim 2 wherein said thermochemical reaction involves the admission of a gas to change the magnetization and removal of said gas to reverse said change.

4. The method of claim 3 wherein said thermochemical reaction involves addition of hydrogen to $LaCo_5$ to reduce the magnetization and removal of hydrogen gas from said environment to increase the magnetization.

5. A thermochemical magnetic generator, comprising:
   magnetic circuit means for providing a flux path and including a permanent magnet and a working magnetic material;
   means for chemically altering said magnetic material to vary its magnetic properties; and
   means for generating an electromagnetic force in response to the varying magnetic properties of said working magnetic material.

6. A method for generating an electromotive force, comprising the steps of
   generating a magnetic force field to induce magnetization in a magnetic circuit; and
   chemically altering the ferromagnetic properties of at least a portion of said magnetic circuit to vary the induced magnetization.

7. The method of claim 6 wherein said altering step comprises
   cyclically altering the environment of said portion to cause a cyclically reversible thermochemical reaction.

8. The method of claim 7 wherein said altering step comprises
   cyclically admitting and removing a substance from the environment.

9. The method of claim 8 wherein said substance is hydrogen, and said portion comprises
   an intermetallic compound which shows a relatively large change in magnetization when hydrided.

10. A thermochemical magnetic generator, comprising:
    magnetic circuit means for providing a flux path including a magnetic field source and a working magnetic material in an environment;
    means for cyclically altering the environment to cause a reversible chemical change in said working magnetic material and thereby cyclically vary its magnetic properties; and
    means for generating an electromagnetic force in response to the varying magnetic properties of said working magnetic material.

11. The thermochemical magnetic generator of claim 10 wherein the working magnetic material includes an intermetallic compound such as lanthanum pentacobalt $LaCo_5$, the environment includes hydrogen gas, and the environment is altered by cyclically reducing and increasing the hydrogen partial pressure.

12. The thermochemical magnetic generator of claim 11 wherein the hydrogen partial pressure is reduced and increased by cyclically connecting the environment to a source of and sink for hydrogen gas.

13. The thermochemical magnetic generator of claim 12 further comprising a plurality of environments containing working magnetic material, with all environments cyclically connected to a common source and sink for the hydrogen gas.

14. The thermochemical magnetic generator of claim 11 wherein the hydrogen partial pressure in the environment is altered by igniting of a combustible hydrogen gas mixture.

15. The thermochemical magnetic generator of claim 10 wherein the magnetic field source includes a permanent magnet.

* * * * *